United States Patent
Ogawa et al.

(10) Patent No.: US 7,126,057 B2
(45) Date of Patent: Oct. 24, 2006

(54) INTEGRATED ELECTRONIC COMPONENT

(75) Inventors: Keiji Ogawa, Fukui (JP); Mitsuhide Kato, Sabae (JP); Yoshinori Yamada, Takefu (JP)

(73) Assignee: Murata Manufacturing Co., Ltd., Kyoto-Fu (JP)

( * ) Notice: Subject to any disclaimer, the term of this patent is extended or adjusted under 35 U.S.C. 154(b) by 0 days.

(21) Appl. No.: 10/774,440

(22) Filed: Feb. 10, 2004

(65) Prior Publication Data

US 2004/0233647 A1    Nov. 25, 2004

(30) Foreign Application Priority Data

May 23, 2003    (JP)    ............... 2003-146550

(51) Int. Cl.
*H02G 3/08*    (2006.01)
*H05K 5/00*    (2006.01)

(52) U.S. Cl. .................... 174/52.1; 361/752

(58) Field of Classification Search ........... 174/52.1, 174/52.3, 52.4; 361/800, 816, 818, 728, 361/730, 748, 752, 753, 807

See application file for complete search history.

(56) References Cited

U.S. PATENT DOCUMENTS

| | | | | |
|---|---|---|---|---|
| 4,841,414 A | * | 6/1989 | Hibino et al. | ............... 361/818 |
| 6,079,099 A | * | 6/2000 | Uchida et al. | ............... 29/837 |
| 6,687,135 B1 | * | 2/2004 | Kitade | ............... 361/816 |
| 6,694,610 B1 | * | 2/2004 | Kitade | ............... 29/840 |
| 6,788,545 B1 | * | 9/2004 | Nakayama | ............... 361/752 |

FOREIGN PATENT DOCUMENTS

JP    2002-353071    12/2002

\* cited by examiner

*Primary Examiner*—Hung V. Ngo
(74) *Attorney, Agent, or Firm*—Keating & Bennett, LLP

(57) ABSTRACT

An integrated electronic component includes a ceramic substrate incorporating circuit elements and/or having circuit elements mounted thereon, and a metal case mounted on the ceramic substrate. Notches are formed in substrate-facing segments of the metal case at the positions opposing the corners of the top surface of the ceramic substrate. The notches have a tapered shape having obtuse angles with respect to the top surface of the substrate. The notches may have a substantially circular arc shape. The substrate-facing segments having the notches are seamlessly connected to side segments of the metal case, bent in the vicinity of the notches, and supported by the bent portions in a cantilevered fashion.

23 Claims, 5 Drawing Sheets

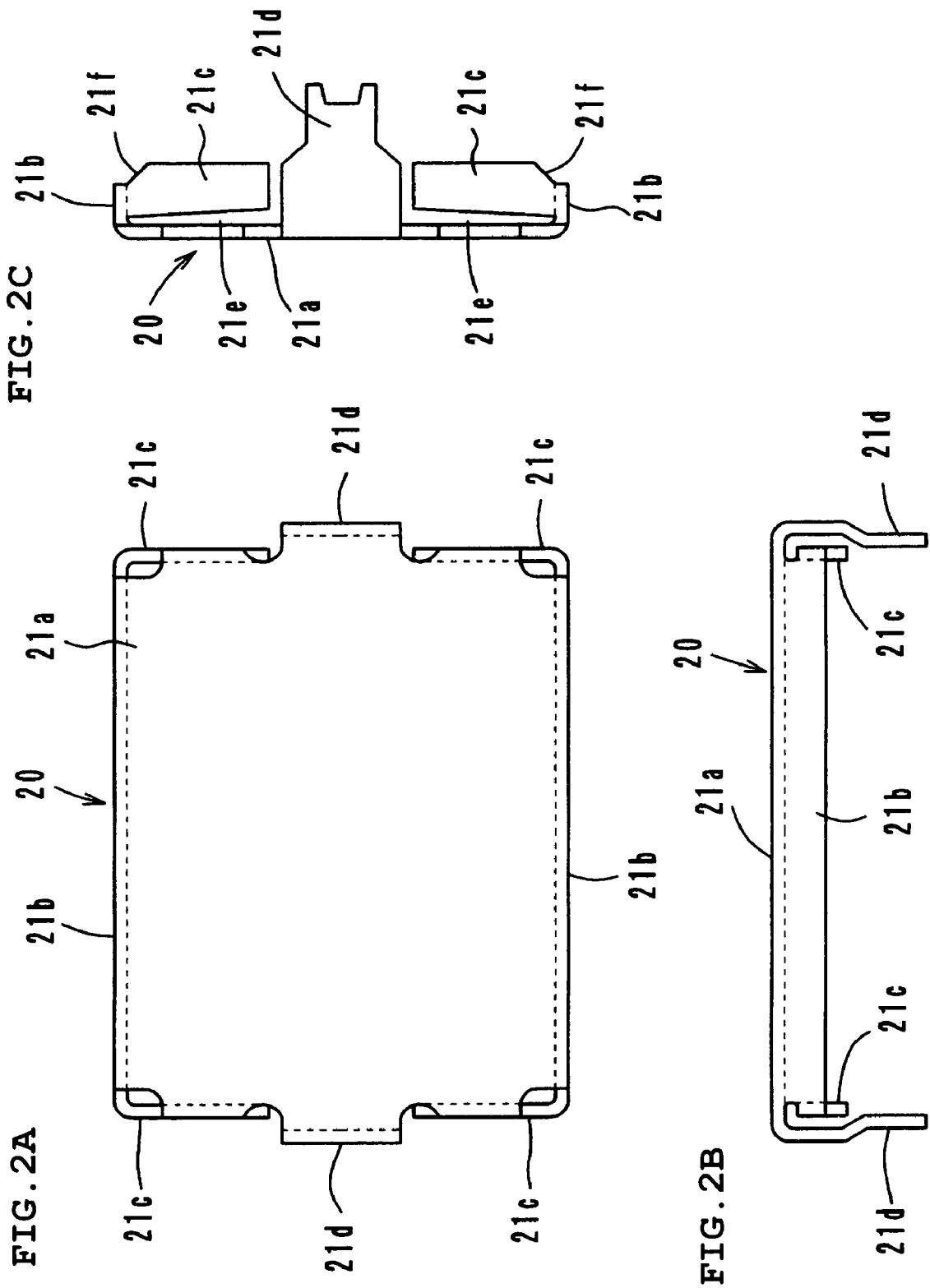

INTEGRATED ELECTRONIC COMPONENT

BACKGROUND OF THE INVENTION

1. Field of the Invention

The present invention relates to an integrated electronic component and, in particular, to an integrated electronic component in which a metal case is mounted on a ceramic substrate incorporating circuit elements and/or having circuit elements mounted thereon.

2. Description of the Related Art

An integrated electronic component disclosed in Japanese Unexamined Patent Application Publication No. 2002-353071 is known as an integrated electronic component incorporating circuit elements, such as capacitors and inductors, and/or having such circuit elements mounted thereon. With reference to FIG. 5, such an integrated electronic component has a metal case 5 disposed on top of a substrate 1 which is composed of a plurality of laminated ceramic sheets.

The substrate 1 incorporates circuit elements (not shown) in its interior and also has circuit elements 4 on its top surface, external electrodes 2 on its front and back surfaces, and external electrodes 3 on its side surfaces. The metal case 5 having a substantially box-like shape is mounted on top of the substrate 1. Terminals 6 protruding from the front and back surfaces of the metal case 5 are soldered to the external electrodes 2 to be electrically connected thereto.

In these integrated electronic components, the metal case 5 frequently receives external downward force A. For example, during assembly of the metal case to the substrate 1, measurement of the electrical characteristics of a finished product, or mounting of the finished product on a wiring board, a tool used in this process pushes down the top surface of the metal case 5. Thus, bottom edges of the metal case 5 push against the top surface of the substrate 1 due to the external force A, thereby disadvantageously causing chips or cracks on the corners 1a of the top surface of the substrate 1.

Stress caused by the force A tends to concentrate on the corners 1a of the top surface of the substrate. In addition, the corners 1a are the weakest portions of the substrate 1, thus being easily damaged.

SUMMARY OF THE INVENTION

In order to overcome the problems described above, preferred embodiments of the present invention provide an integrated electronic component whose ceramic substrate is not damaged by external force applied to a metal case of the integrated electronic component.

According to a first preferred embodiment of the present invention, an integrated electronic component includes a ceramic substrate incorporating circuit elements and/or having circuit elements mounted thereon, and a metal case having at least a top segment and substrate-facing segments and being mounted on the ceramic substrate. The bottom edges of the substrate-facing segments oppose the top surface of the ceramic substrate. Notches are formed in the substrate-facing segments at the positions opposing the corners of the top surface of the ceramic substrate, and the notches have a tapered shape having obtuse angles with respect to the bottom edges of the substrate-facing segments.

According to a second preferred embodiment of the present invention, an integrated electronic component includes a ceramic substrate incorporating circuit elements and/or having circuit elements mounted thereon, and a metal case having at least a top segment and substrate-facing segments and being mounted on the ceramic substrate. The bottom edges of the substrate-facing segments oppose the top surface of the ceramic substrate. Notches are formed in the substrate-facing segments at the positions opposing the corners of the top surface of the ceramic substrate, and the notches preferably have a substantially circular arc shape.

According to the first preferred embodiment of the present invention, the notches are formed on the substrate-facing segments at the positions opposing the corners of the top surface of the ceramic substrate, and the notches have a tapered shape having obtuse angles with respect to the bottom edges of the substrate-facing segments. According to the second preferred embodiment of the present invention, the notches preferably have a substantially circular arc shape. Therefore, when a downward external force is applied to the metal case, these notches widely distribute the pushing pressure. As a result, damage, such as a chip or a crack, is not caused at the corners of the top surface of the substrate, which are stress concentration spots and also weak spots.

In particular, according to the first and second preferred embodiments of the present invention, the substrate-facing segments of the metal case are preferably connected to the side segments of the metal case seamlessly at the positions opposing the corners of the top surface of the ceramic substrate, the substrate-facing segments have spaces between the upper edges of substrate-facing segments and the top segment, and the substrate-facing segments are supported by borders with the side segments in a cantilevered fashion. The substrate-facing segments can be elastically deformed by the spaces, thus distributing the pushing pressure more efficiently when the downward external force is applied to the metal case.

Other features, elements, characteristics and advantages of the present invention will become more apparent from the following detailed description of preferred embodiments with reference to the attached drawings.

BRIEF DESCRIPTION OF THE DRAWINGS

FIG. 1 shows an integrated electronic component according to a first preferred embodiment of the present invention, where

FIG. 2 shows a metal case according to the first preferred embodiment, where FIG. 2A is a plan view, FIG. 2B is a front view, and FIG. 2C is a side elevation view;

DETAILED DESCRIPTION OF PREFERRED EMBODIMENTS

Preferred embodiments of an integrated electronic component in accordance with the present invention will now be described with reference to the accompanying drawings.

Figure 1A:
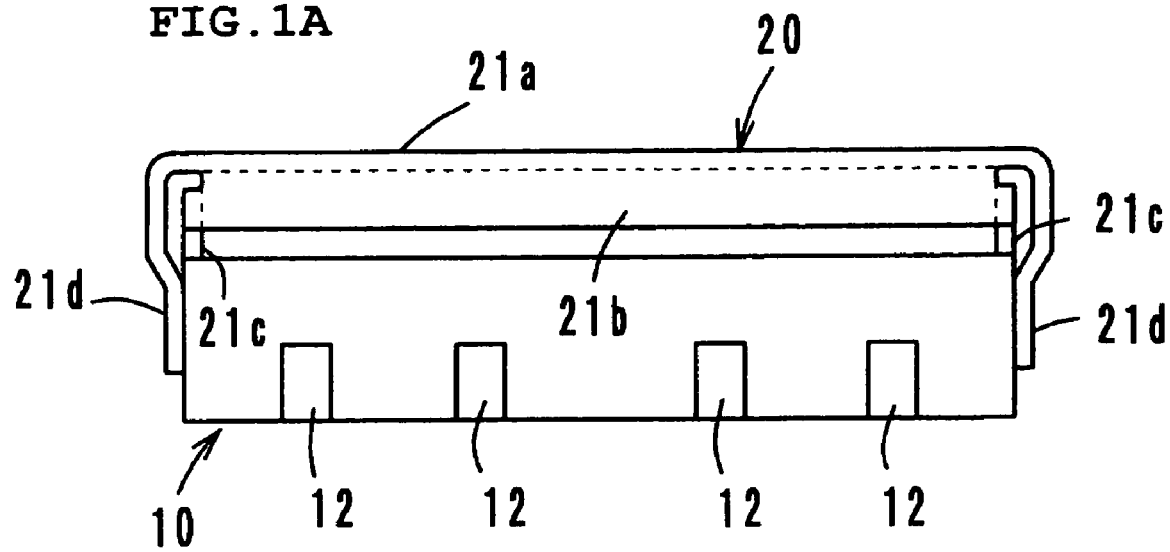
FIG. 1A is a front view and FIG. 1B is a side elevation view.
Figure 1B:
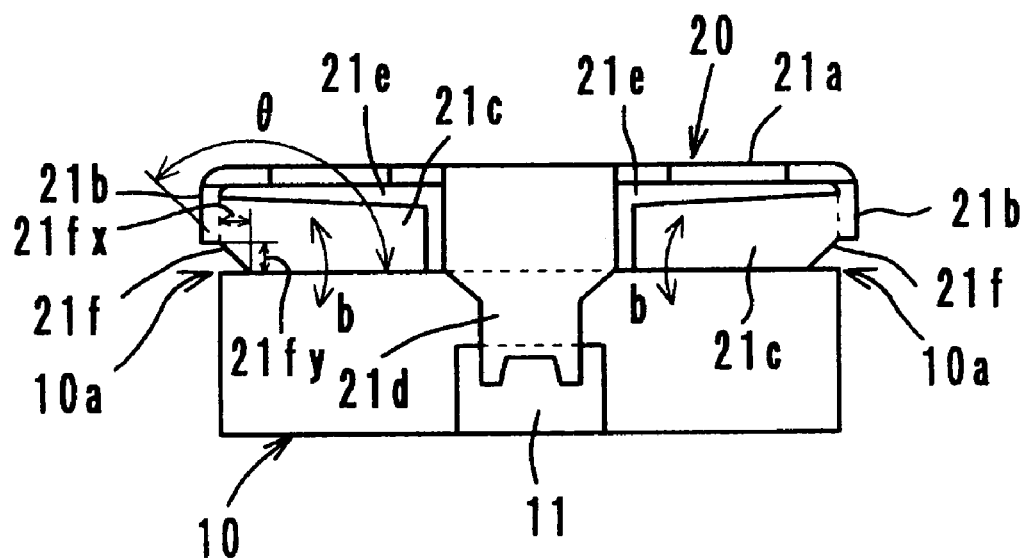
Figure 3:
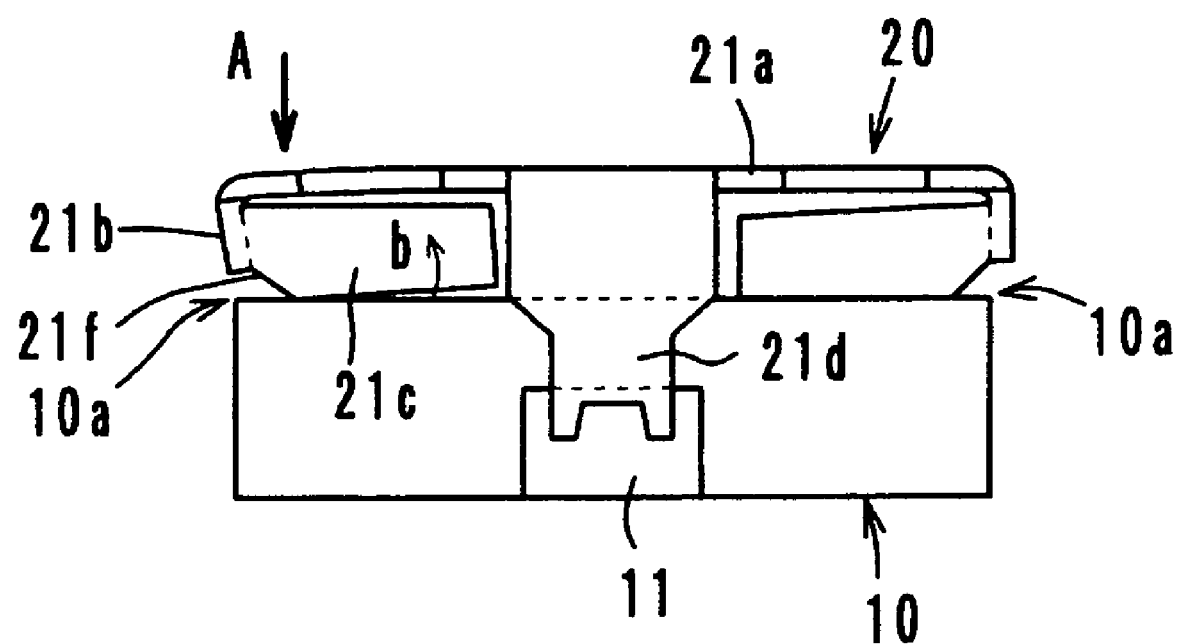
FIG. 3 is a side elevation view of the metal case according to the first preferred embodiment when external force is applied to the metal case.

First Preferred Embodiment (FIGS. 1 to 3)

With reference to FIG. 1, an integrated electronic component according to a first preferred embodiment includes a metal case 20 preferably made of phosphor bronze or white metal (nickel silver) mounted on top of a ceramic substrate 10 including a plurality of laminated ceramic sheets.

The ceramic substrate 10 is preferably made by forming capacitor patterns, inductor patterns, and resistor patterns (none are shown) on ceramic green sheets, laminating these green sheets to define predetermined circuit elements, and then firing the green sheets. The incorporated circuit elements are electrically connected to each other by, for example, via holes. The ceramic substrate 10 has external ground electrodes 11 on its front and back surfaces and external electrodes 12 for input/output or grounding on its side surfaces, and accordingly the external electrodes 11, 12 are not disposed in the corners of the top surface of the ceramic substrate 10. The external electrodes are connected to the incorporated circuit elements.

The ceramic substrate 10 may have circuit elements, such as capacitors, inductors, and ICs (none are shown), on its top surface.

With reference to FIG. 2, the metal case 20 preferably has a substantially box-like shape, which includes a top segment 21a, side segments 21b, substrate-facing segments 21c, and terminal segments 21d. The top segment 21a is planar and flexible so that it can deflect by a normal external force. The thickness of the top segment 21c is relatively thin, preferably in the range from about 0.05 mm to about 0.15 mm, for example.

Each of the side segments 21b has a height so that the bottom edge is not in contact with the top surface of the ceramic substrate 10 by a predetermined space therebetween. Each side segment 21b is disposed right above the corresponding side edge of the top surface of the ceramic substrate 10 so that each side segment 21b is flush with each side surface of the ceramic substrate 10. This design facilitates positioning of the metal case when it is attached to the substrate. The terminal segments 21d are forked at the ends thereof. The end of each terminal segment 21d is soldered and is electrically and mechanically connected to the external ground electrode 11, which is positioned at the center bottom of the front or back surfaces of the ceramic substrate 10.

The bottom edges of the substrate-facing segments 21c are in contact with the top surface of the ceramic substrate 10. Side edges of the substrate-facing segments 21c and the side segments 21b are connected at the positions opposing the corners 10a of the ceramic substrate 10. Further, predetermined spaces 21e are formed between top edges of the substrate-facing segments 21c and the top segment 21a. The substrate-facing segments 21c need not be in contact with the top surface of the ceramic substrate 10. Instead, the substrate-facing segments 21c and the top surface of the ceramic substrate 10 may oppose each other with spaces therebetween. The spaces are preferably determined such that the bottom edges of the substrate-facing segments 21c come into contact with the ceramic substrate 10 when a normal downward external force A is applied to the metal case 20.

The metal case 20 is preferably formed from a single metal plate, which is stamped out into a predetermined developed shape and is processed by bending. The substrate-facing segments 21c are bent along borders with the side segments 21b, and have the spaces 21e between their top edges and the top segment 21a. That is, the substrate-facing segments 21c are supported in a cantilevered fashion by only the borders with the side segments 21b, which are located at the positions opposing the corners 10a, and allow elastic-deformation pivoting about the borders as fulcrums in the direction of arrow b shown in FIG. 1B.

In addition, the substrate-facing segments 21c have tapered notches 21f at the positions opposing the corners 10a of the ceramic substrate 10. The tapers of the notches 21f form angles θ with respect to the bottom edges of the substrate-facing segments 21c. The angles θ, which are obtuse, basically prevent the damage of the corners 10a of the ceramic substrate 10. However, the most preferable design will be described as follows.

With reference to FIG. 3, in the above-described integrated electric component, when the downward external force A is applied to the metal case 20, pushing pressure from the substrate-facing segments 21c is concentrated on the corners 10a of the top surface of the ceramic substrate 10. Since the concentrated portions have the notches 21f, the pushing pressure is distributed and stress is not concentrated on the corners 10a of the top surface of the ceramic substrate 10. As a result, damage, such as a chip or a crack, does not occur at the corners 10a of the top surface of the substrate 10, which are relatively weak spots.

In particular, since the substrate-facing segments 21c are supported by only the borders with the side segments 21b in a cantilevered fashion, the downward external force A elastically deforms the substrate-facing segments 21c as indicated by arrow b shown in FIG. 3. Accordingly, the pushing pressure on the ceramic substrate 10 is more effectively distributed.

Each of the notches 21f will now be described in detail. The optimum size of the notch 21f is determined by adjusting the angle θ. That is, the range of angle θ is preferably $145° \leq \theta \leq 170°$. If the angle θ exceeds about 170°, a tapered portion of the notches 21f easily comes into contact with the corner 10a even if deformation of the substrate-facing segments 21c, indicated by the arrow b, is small. This reduces the desirable effect. On the other hand, if the angle θ is smaller than about 145°, the length of the border between the substrate-facing segment 21c and the side segment 21b is reduced, thus reducing the strength of the border portion.

Additionally, the most suitable lengths 21fx in the X direction and 21fy in the Y direction of the notch 21f are determined by the size of the ceramic substrate 10 under the above-described preferable range of the angle θ. That is, the range of the length 21fx is preferably $0.25 \text{ mm} \leq 21fx \leq 0.30$ mm, for example, and the range of the length 21fy is preferably $0.05 \text{ mm} \leq 21fy \leq 0.15$ mm, for example. The length of the ceramic substrate 10, shown in FIG. 1A, preferably ranges from about 5.0 mm to about 6.5 mm, for example, and the width, shown in FIG. 1B, preferably ranges from about 4.0 mm to about 4.5 mm, for example.

Figure 4:
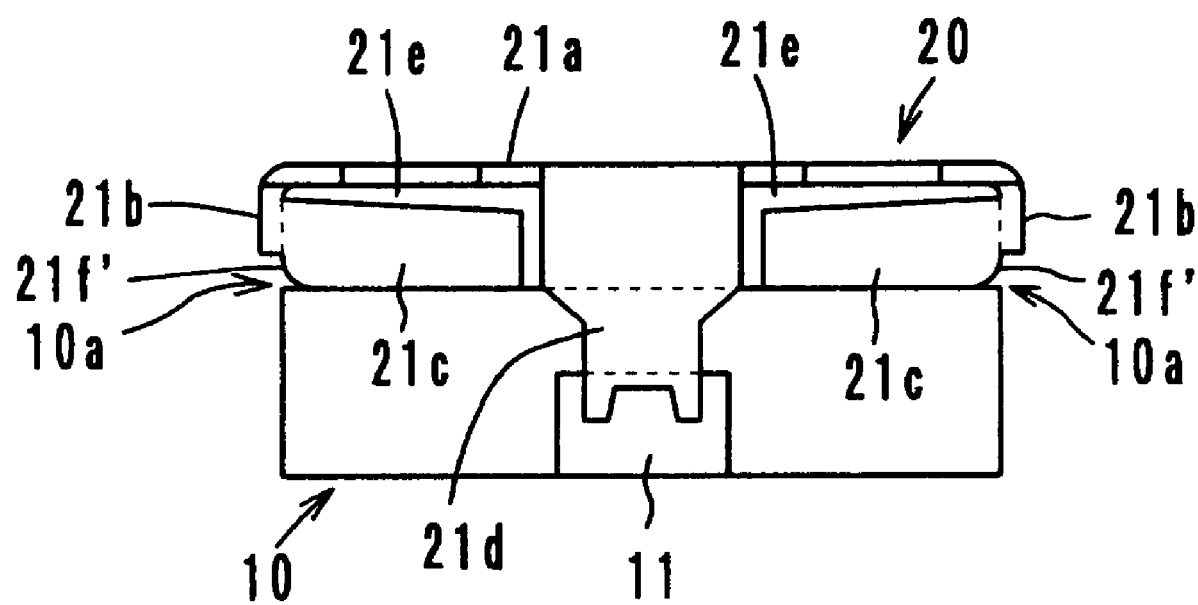
FIG. 4 is a side elevation view of an integrated electronic component according to a second preferred embodiment of the present invention.
Figure 5:
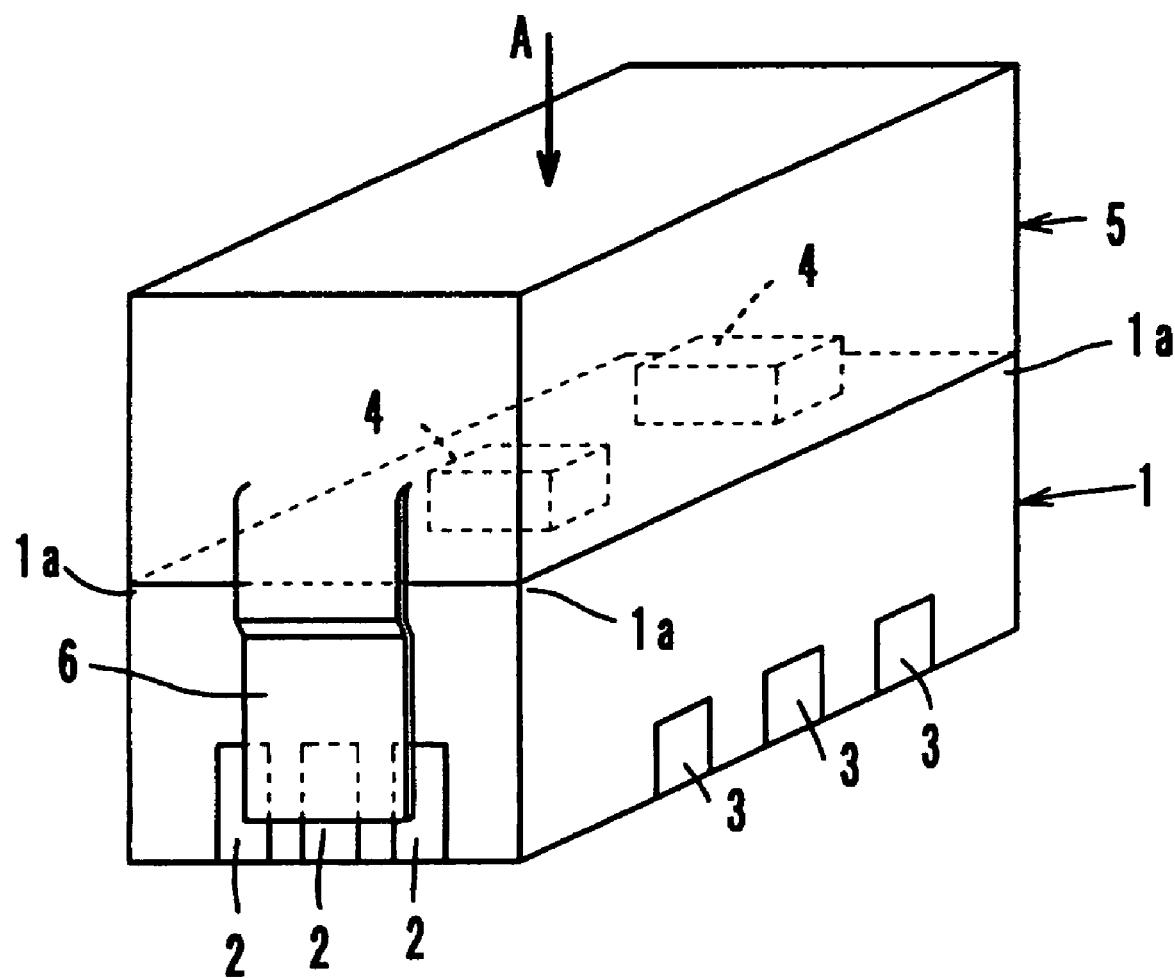
FIG. 5 is a perspective view of a known integrated electronic component.

Second Preferred Embodiment (FIG. 4.)

With reference to FIG. 4, in an integrated electronic component according to a second preferred embodiment, the substrate-facing segments 21c of the metal case 20 have notches 21f preferably having a substantially convex circular arc shape facing downward at the positions opposing the corners 10a of the top surface of the ceramic substrate 10. Other elements are identical to those in the above-described first preferred embodiment. The same reference numerals are used in FIG. 4 and FIGS. 1 to 3 to identify the same elements and blocks, and duplicated descriptions are omitted.

Herein, a radius of curvature R of the notches 21f is preferably about 0.05 mm to about 0.2 mm, for example, about 0.1 mm. If the radius of curvature R is smaller than about 0.05 mm, the substantially circular arc portion of the notches 21f easily comes into contact with the corner 10a even if the deformation of the substrate-facing segments 21c is small. This reduces the desirable effect. On the other hand, a radius of curvature R exceeding about 0.2 mm reduces the length of the border between the substrate-facing segment 21c and the side segment 21b, and thus reduces the strength of the border portion.

In this second preferred embodiment, instead of the notches 21f having a linear shape, the notches 21f having a substantially circular arc shape are formed. When the downward external force A is applied to the metal case 20, the stress normally concentrated on the corners 10a of the top surface of the ceramic substrate 10 is more smoothly distributed. The substrate-facing segments 21c are elastically deformed by the external force as in the first preferred embodiment.

OTHER EMBODIMENTS

An integrated electronic component according to the present invention is not limited to the above-described preferred embodiments. Numerous and various modifications can be made without departing from the spirit of the present invention.

In particular, the structure of the ceramic substrate and the detailed shape of the metal case can be determined freely. Also, while the terminal segments 21d are soldered to the external electrodes 11 in the above-described preferred embodiments, a method for securing the metal case and the ceramic substrate can be determined freely. In addition, various types of circuit elements, which are incorporated in the ceramic substrate or mounted on the ceramic substrate, can be used.

What is claimed is:

1. An integrated electronic component comprising:
   a ceramic substrate including circuit elements and external electrodes disposed on side surfaces of the ceramic substrate; and
   a metal case having a top segment and substrate-facing segments and being mounted on the ceramic substrate; wherein
   bottom edges of the substrate-facing segments oppose a top surface of the ceramic substrate, the substrate-facing segments have notches at positions opposing corners of the top surface of the ceramic substrate, and the notches have a tapered shape having obtuse angles with respect to the bottom edges of the substrate-facing segments; and
   the external electrodes are not disposed in the corners of the top surface of the ceramic substrate.

2. An integrated electronic component according to claim 1, wherein the metal case includes side segments, the substrate-facing segments are seamlessly connected to the side segments at positions opposing the corners of the top surface of the ceramic substrate, and the substrate-facing segments are separated from the top segment, thereby the substrate-facing segments being supported at borders with the side segments in a cantilevered fashion.

3. An integrated electronic component according to claim 1, wherein the circuit elements are disposed within the ceramic substrate.

4. An integrated electronic component according to claim 1, wherein the circuit elements are mounted on the ceramic substrate.

5. An integrated electronic component according to claim 1, wherein the metal case is of at least one of phosphor bronze and nickel silver.

6. An integrated electronic component according to claim 1, wherein the ceramic substrate includes a plurality of laminated ceramic sheets.

7. An integrated electronic component according to claim 1, wherein the metal case has a substantially box-like shape.

8. An integrated electronic component according to claim 1, wherein the obtuse angles are within the range of $145° \leq \theta \leq 170°$.

9. An integrated electronic component according to claim 1, wherein each of the notches has a length in a first direction that is within the range of about 0.25 mm to about 0.30 mm and a length in a second direction that is within the range of about 0.05 mm to about 0.15 mm.

10. An integrated electronic component according to claim 1, wherein the ceramic substrate has a length of about 5.0 mm to about 6.5 mm, and has a width of about 4.0 mm to about 4.5 mm.

11. An integrated electronic component comprising:
    a ceramic substrate including circuit elements and external electrodes disposed on side surfaces of the ceramic substrate; and
    a metal case having a top segment and substrate-facing segments and being mounted on the ceramic substrate; wherein
    bottom edges of the substrate-facing segments oppose a top surface of the ceramic substrate, the substrate-facing segments have notches at positions opposing corners of the top surface of the ceramic substrate, and the notches have a substantially circular arc shape; and
    the external electrodes are not disposed in the corners of the top surface of the ceramic substrate.

12. An integrated electronic component according to claim 11, wherein the metal case includes side segments, the substrate-facing segments are seamlessly connected to the side segments at positions opposing the corners of the top surface of the ceramic substrate, and the substrate-facing segments are separated from the top segment, thereby the substrate-facing segments being supported at borders with the side segments in a cantilevered fashion.

13. An integrated electronic component according to claim 11, wherein the circuit elements are disposed within the ceramic substrate.

14. An integrated electronic component according to claim 11, wherein the circuit elements are mounted on the ceramic substrate.

15. An integrated electronic component according to claim 11, wherein the metal case is of at least one of phosphor bronze and nickel silver.

16. An integrated electronic component according to claim 11, wherein the ceramic substrate includes a plurality of laminated ceramic sheets.

17. An integrated electronic component according to claim 11, wherein the metal case has a substantially box-like shape.

18. An integrated electronic component according to claim 11, wherein a radius of curvature R of the notches is about 0.05 mm to about 0.2 mm.

19. An integrated electronic component according to claim 11, wherein the ceramic substrate has a length of about 5.0 mm to about 6.5 mm, and has a width of about 4.0 mm to about 4.5 mm.

20. An integrated electronic component comprising:
    a ceramic substrate including circuit elements; and a metal case having a top segment and substrate-facing segments and being mounted on the ceramic substrate; wherein bottom edges of the substrate-facing segments oppose a top surface of the ceramic substrate, the substrate-facing segments have notches at positions opposing corners of the top surface of the ceramic substrate, and the notches have a tapered shape having obtuse angles with respect to the bottom edges of the substrate-facing segments; and a portion of a top edge of each of the substrate-facing segments is spaced from a bottom surface of the top segment.

21. An integrated electronic component comprising:

a ceramic substrate including circuit elements; and a metal case having a top segment and substrate-facing segments and being mounted on the ceramic substrate; wherein bottom edges of the substrate-facing segments oppose a top surface of the ceramic substrate, the substrate-facing segments have notches at positions opposing corners of the top surface of the ceramic substrate, and the notches have a substantially circular arc shape; and a portion of a top edge of each of the substrate-facing segments is spaced from a bottom surface of the top segment.

22. An integrated electronic component comprising:

a ceramic substrate including circuit elements; and a metal case having a top segment and substrate-facing segments and being mounted on the ceramic substrate; wherein bottom edges of the substrate-facing segments oppose a top surface of the ceramic substrate, the substrate-facing segments have notches at positions opposing corners of the top surface of the ceramic substrate, and the notches have a tapered shape having obtuse angles with respect to the bottom edges of the substrate-facing segments; and the metal case includes side segments, the substrate-facing segments are seamlessly connected to the side segments at positions opposing the corners of the top surface of the ceramic substrate, such that the substrate-facing segments are supported at borders with the side segments in a cantilevered fashion.

23. An integrated electronic component comprising:

a ceramic substrate including circuit elements; and a metal case having a top segment and substrate-facing segments and being mounted on the ceramic substrate; wherein bottom edges of the substrate-facing segments oppose a top surface of the ceramic substrate, the substrate-facing segments have notches at positions opposing corners of the top surface of the ceramic substrate, and the notches have a substantially circular arc shape; and the metal case includes side segments, the substrate-facing segments are seamlessly connected to the side segments at positions opposing the corners of the top surface of the ceramic substrate, such that the substrate-facing segments are supported at borders with the side segments in a cantilevered fashion.

* * * * *